United States Patent
Scott

(10) Patent No.: US 6,795,787 B2
(45) Date of Patent: Sep. 21, 2004

(54) METHOD AND APPARATUS FOR CALIBRATING A SAMPLING CIRCUIT

(75) Inventor: Jonathan B. Scott, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 21 days.

(21) Appl. No.: 10/256,765

(22) Filed: Sep. 26, 2002

(65) Prior Publication Data

US 2004/0064282 A1 Apr. 1, 2004

(51) Int. Cl.[7] .............................................. G06F 12/00
(52) U.S. Cl. ......................... 702/107; 702/94; 702/96; 702/106
(58) Field of Search .............................. 702/27, 48, 60, 702/94, 96, 106, 107, 21, 31, 61, 65, 77, 143, 166, 190; 324/76.54; 705/50

(56) References Cited

U.S. PATENT DOCUMENTS

| | | | | |
|---|---|---|---|---|
| 5,953,681 A | * | 9/1999 | Cantatore et al. | ............. 702/31 |
| 5,994,892 A | * | 11/1999 | Turino et al. | ................ 324/142 |
| 6,411,244 B1 | * | 6/2002 | Dobos et al. | ................ 341/155 |
| 6,474,158 B2 | * | 11/2002 | Czarnek | ....................... 73/313 |

* cited by examiner

Primary Examiner—Marc S. Hoff
Assistant Examiner—Felix Suarez

(57) ABSTRACT

An apparatus and method for calibrating a first sampling circuit with a second sampling circuit having a similar impulse response. The second sampling circuit includes a sample and hold circuit that provides an output indicative of the potential at the sampling circuit input of the second sampling circuit at a time determined by a signal at the trigger pulse input of the second sampling circuit. The apparatus includes a trigger pulse generating circuit for generating a sequence of trigger pulse pairs, each pair having a first pulse that is delayed relative to a second pulse. Each pulse is applied to a corresponding trigger input of the sampling circuits. The first sampling circuit is assumed to generate a kick-out pulse indicative of its impulse response when triggered by the first pulse. A controller measures the output of the second sampling circuit for each delay.

8 Claims, 3 Drawing Sheets

METHOD AND APPARATUS FOR CALIBRATING A SAMPLING CIRCUIT

FIELD OF THE INVENTION

The present invention relates to sampling oscilloscopes, and more particularly, to a method and apparatus for measuring the complex frequency response of the sampling circuit utilized in such oscilloscopes.

BACKGROUND OF THE INVENTION

Many electrical signals of interest have bandwidths that are much greater than the bandwidth of a typical oscilloscope. Hence, measuring such signals on an oscilloscope presents a problem. A sampling oscilloscope circumvents this problem for repetitive signals by utilizing a sampling circuit that measures the signal over a very brief time interval and displaying the resulting sample as one point of a graph. Typically, one sample is taken during each period of the repetitive signal. The time of the sample relative to the beginning of the signal repetition is varied in each period. Hence, the collection of samples can be displayed to provide a conventional display of voltage as a function of time.

A key component in such oscilloscopes is the sampling circuit that captures the signal voltage over the short sampling time interval. The sampling circuit is basically a very fast switch coupled to a capacitor that stores the potential value seen when the switch opens. The impulse response of this switch determines the time value over which the signal is measured. Variations in signal intensity that occur over time intervals much smaller than this time cannot be easily observed. Hence, the impulse response of this switch must either be known or must be faster than some predetermined design specification. Unfortunately, measuring the impulse response of the sampling stage is difficult.

For one class of sampling switches, the impulse response function is virtually identical to a signal that is generated by the switch and which exits through the same connector as the signal that is normally to be measured enters. In this type of sampling oscilloscope, the impulse response function can be measured by using this signal as the input to an identical oscilloscope. In this type of "nose-to-nose" testing, a common trigger pulse triggers the two oscilloscopes and the internal time bases of the oscilloscopes are used to measure the convolution of the impulse response function with itself. The actual impulse response function can then be extracted from these measurements. This type of calibration procedure is discussed in detail in Jan Verspecht and Ken Rush, "Individual Characterization of Broadband Oscilloscopes with a Nose-to-Nose Calibration Procedure", IEEE Transactions on Instrumentation and Measurement, vol. 43, no. 2, April 1994, pp. 347–354.

While this prior art calibration procedure provides the desired data, the calibration process is very time consuming, often requiring more than 24 hours to complete due to the lengthy calibration processes needed. As a result of the time needed to calibrate the sampling circuit, the procedure is too expensive to be performed on each sampling unit during manufacture. In addition, re-calibration of the sampling circuit in the field is normally impossible.

The high time costs of performing this type of calibration are the result of a number of factors. First, the time bases in the oscilloscopes determine the sampling points. While small non-linearities in these time bases are acceptable in normal oscilloscope operation, such non-linearities introduce significant errors into the impulse response measurements. To remove these artifacts, the time bases must be very accurately calibrated. The time bases, however, drift with time and temperature by a significant amount that would introduce significant errors into the impulse response measurements. Hence, the time base calibration must be performed at the beginning and end of the impulse response measurement.

Second, the common trigger source and two time bases introduce a significant amount of "jitter" that must also be taken into account by the calibration software. To correct for this jitter, the measurements must be repeated a large number of times to obtain relevant averages. In addition, the statistical distribution of the jitter must also be measured.

Broadly, it is the object of the present invention to provide an improved apparatus and method for calibrating the sampling stage of a sampling oscilloscope.

This and other objects of the present invention will become apparent to those skilled in the art from the following detailed description of the invention and the accompanying drawings.

SUMMARY OF THE INVENTION

An apparatus and method for calibrating a first sampling circuit with a second sampling circuit are constructed according to the embodiments of the invention. Each sampling circuit has a signal input for receiving a signal to be sampled and a trigger input for receiving a trigger pulse that opens a switching circuit in that sampling circuit. The second sampling circuit includes a sample and hold circuit that provides an output indicative of the potential at the sampling circuit input of the second sampling circuit at a time determined by a signal at the trigger pulse input of the second sampling circuit. The signal inputs of the first and second sampling circuits are connected by a signal conductor. The calibration apparatus includes a trigger pulse generating circuit for generating a sequence of trigger pulse pairs, each trigger pulse pair including a first pulse that is delayed relative to a second pulse. A connecting circuit applies the first pulse to the trigger input of the first sampling circuit and the second pulse to the trigger input of the second sampling circuit. A controller sets the delay between the first and second pulses and measures the output of the sample and hold circuit in the second sampling circuit for each delay. The trigger pulse generating circuit preferably includes a variable delay line that is controlled by an actuator such as a stepping motor. The second sampling circuit is preferably part of a sampling module in an oscilloscope. The module is connected to the oscilloscope by an interface connector and the connecting circuit of the present invention. The connecting circuit of the present invention includes an extension card having a first connector that mates to the interface connector and a second connector that mates to the module. The second sampling circuit is assumed to have an impulse response that is approximately the same as that of the first sampling circuit. In the event that the assumption of equivalence of the first and second sampling circuits cannot be made, a similar procedure using three non-equivalent sampling circuits in pairs can be utilized.

DETAILED DESCRIPTION OF THE PREFERRED EMBODIMENTS OF THE INVENTION

Figure 1:
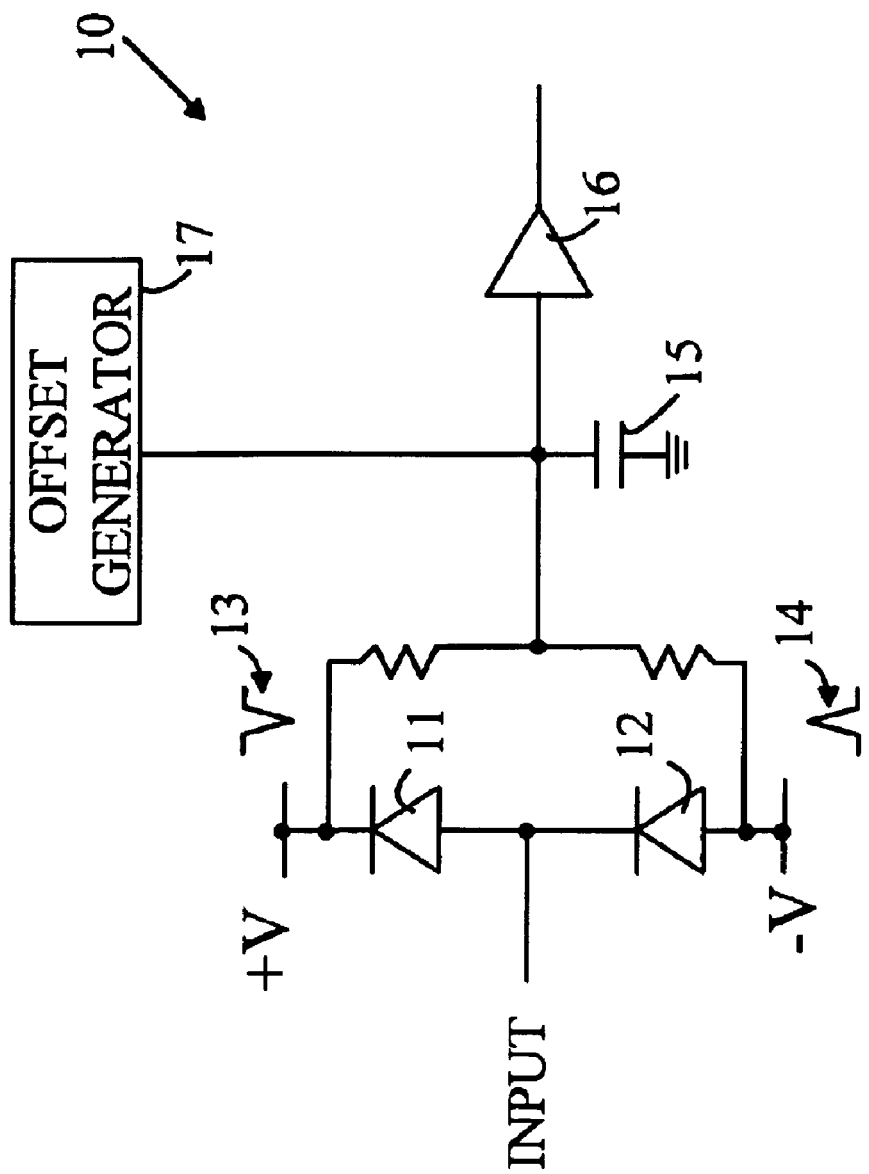
FIG. 1 is a schematic drawing of a sampling stage 10 for use with the present invention.

The present invention provides a means for measuring the impulse response of the sampling stage of oscilloscopes that utilize a stage that generates an output pulse that is characteristic of the impulse response when the sampling stage is triggered. The manner in which this class of sampling stages operates can be more easily understood with reference to FIG. 1, which is a schematic drawing of a sampling stage 10 that can be calibrated using the present invention. Sampling stage 10 utilizes two diodes shown at 11 and 12 to gate the input signal onto capacitor 15. Diodes 11 and 12 are normally held in a non-conducting state by the application of an appropriate bias potential. The diodes are shifted to a conducting state for a brief period of time by the application of the sampling signals shown at 13 and 14. Capacitor 15 and amplifier 16 provide a sample and hold function, which captures the potential of the input signal during the sampling period.

In general, capacitor 15 is biased by an offset generator 17 to provide an offset that controls the vertical position of the trace on the oscilloscope screen. The amount of this bias is determined by a control on the front of the oscilloscope. Consider the case in which there is no input signal when the diodes are switched into the conducting state. The charge on capacitor 15 generated by the bias generator is free to leave the capacitor via the diodes and generate a signal on the input terminal. This signal has a shape that is related to the impulse response of the sampling circuit. Hence, if this signal can be accurately measured, the impulse response of the sampling stage can be determined.

Figure 2:
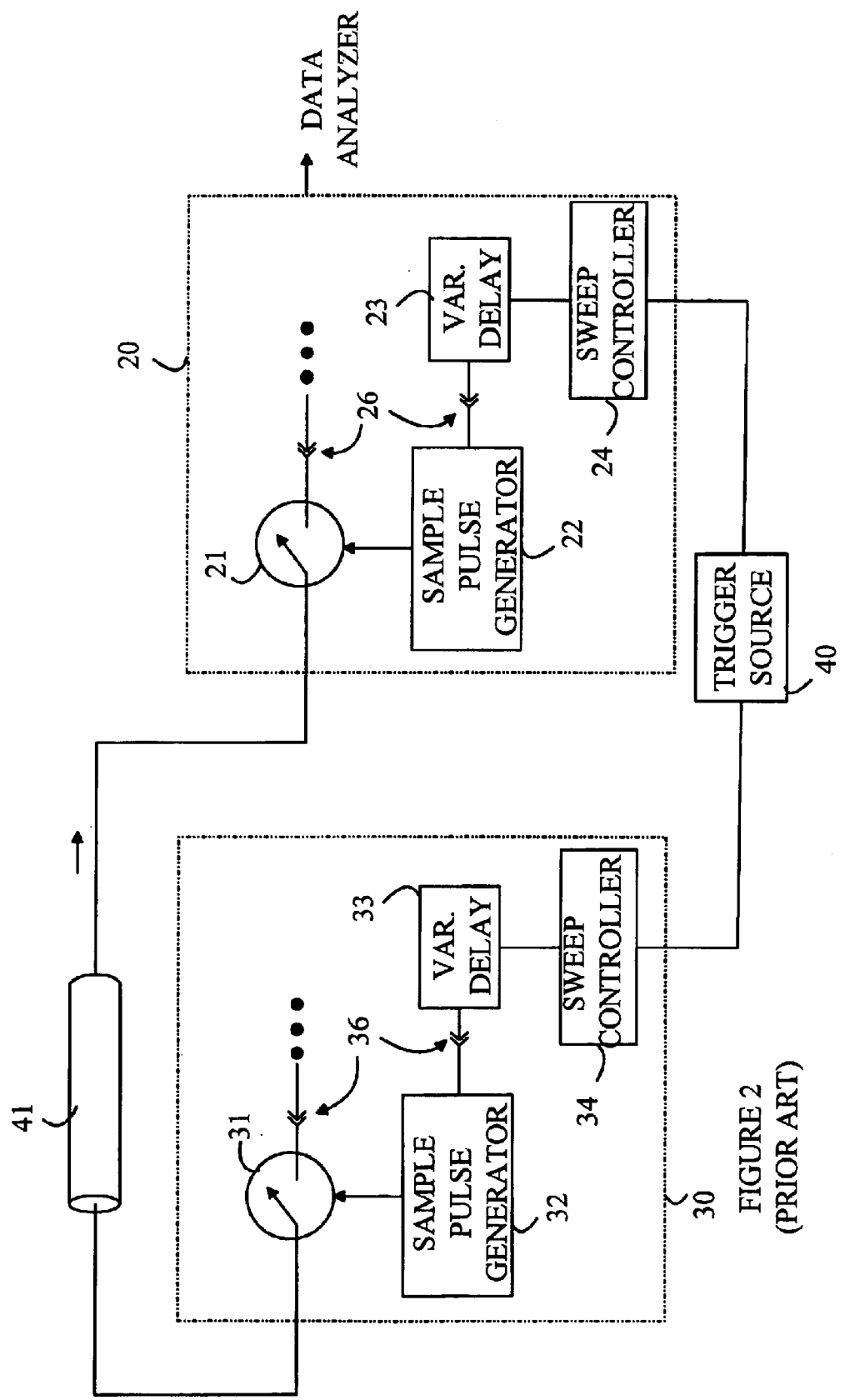
FIG. 2 is a block diagram of a prior art nose-to-nose measurement setup for measuring the impulse response function of the sampling circuit in a first oscilloscope 30 using a second oscilloscope 20.

In principle, this signal can be measured utilizing another sampling oscilloscope having an impulse response that is of the same order of magnitude as that of the sampling stage that is to be measured. Refer now to FIG. 2, which is a block diagram of a prior art nose-to-nose measurement setup for measuring the impulse response function of the sampling circuit in a first oscilloscope 30 using a second oscilloscope 20. The pulse generated by oscilloscope 30 when its sampling circuit 31 is triggered will be referred to as the "kick-out pulse". The nose-to-nose measured response of two samplers is the convolution of the kick-out pulse and the impulse response of the second sampler. A kick-out pulse from a sampler is identical in shape and duration to the impulse response of that sampler. The impulse response is calculated from the square root of the nose-to-nose measurement after transformation to frequency domain.

For the purposes of this discussion, assume that the sampling system in oscilloscope 30 can be programmed to take a single "sample" each time a trigger pulse is received by sweep controller 34. That is, on each trigger pulse, sweep controller 34 triggers variable delay generator 33 once, which triggers sampling pulse generator 32. Also assume that trigger source 40 generates trigger signals at a constant rate. Hence, the input of oscilloscope 30 will generate a sequence of kick-out pulses at a constant rate. Denote the period between pulses by T. Oscilloscope 20 will attempt to measure this waveform by sampling its input every T+nτ seconds, for n=0, 1, 2, . . . , where τ<<T. The sampling delay is generated by sweep controller 24, which controls a variable delay circuit 23 whose output triggers sample pulse generator 22. Sample pulse generator 22 generates sampling pulses 12 and 13 shown in FIG. 1. Each measurement represents the convolution of the two signals offset by nτ for each value of n. This data can then be analyzed, in principle, to deduce the impulse response of the sampling circuit.

This setup assumes that the variable delays 23 and 33 in oscilloscopes 20 and 30, respectively, are precisely known and reproducible from sweep to sweep. Unfortunately, the variable delay circuits present in commercial oscilloscopes are not sufficiently precise, and hence, the lengthy calibration procedure discussed above must be utilized.

In addition, the above description assumed that oscilloscope 30 could be configured such that it only executed one sample for each trigger pulse received by sweep controller 34. In practice, most oscilloscopes provide for a minimum number of samples that is considerably greater than this. If oscilloscope 30 executes 10 samples for each trigger pulse, only the first trigger pulse in the sample will provide useful data. Hence, 90 percent of the data generated will need to be discarded by the data analysis programs. This increases the complexity of the data analysis and further increases the time needed to complete the calibration.

The present invention makes use of a design feature that is present in most sampling oscilloscopes. A sampling oscilloscope is often created by inserting one or more plug-in modules in a separable mainframe. In particular, the sampling switch and the sample pulse generator are normally supplied on one plug-in module. The connectors that connect the sample pulse generator to the variable delay circuits are shown at 26 and 36. During the servicing of an oscilloscope such as those shown in FIG. 2, an extension board can be plugged into the module bay to provide accessibility to the module while the module is operating.

Figure 3:
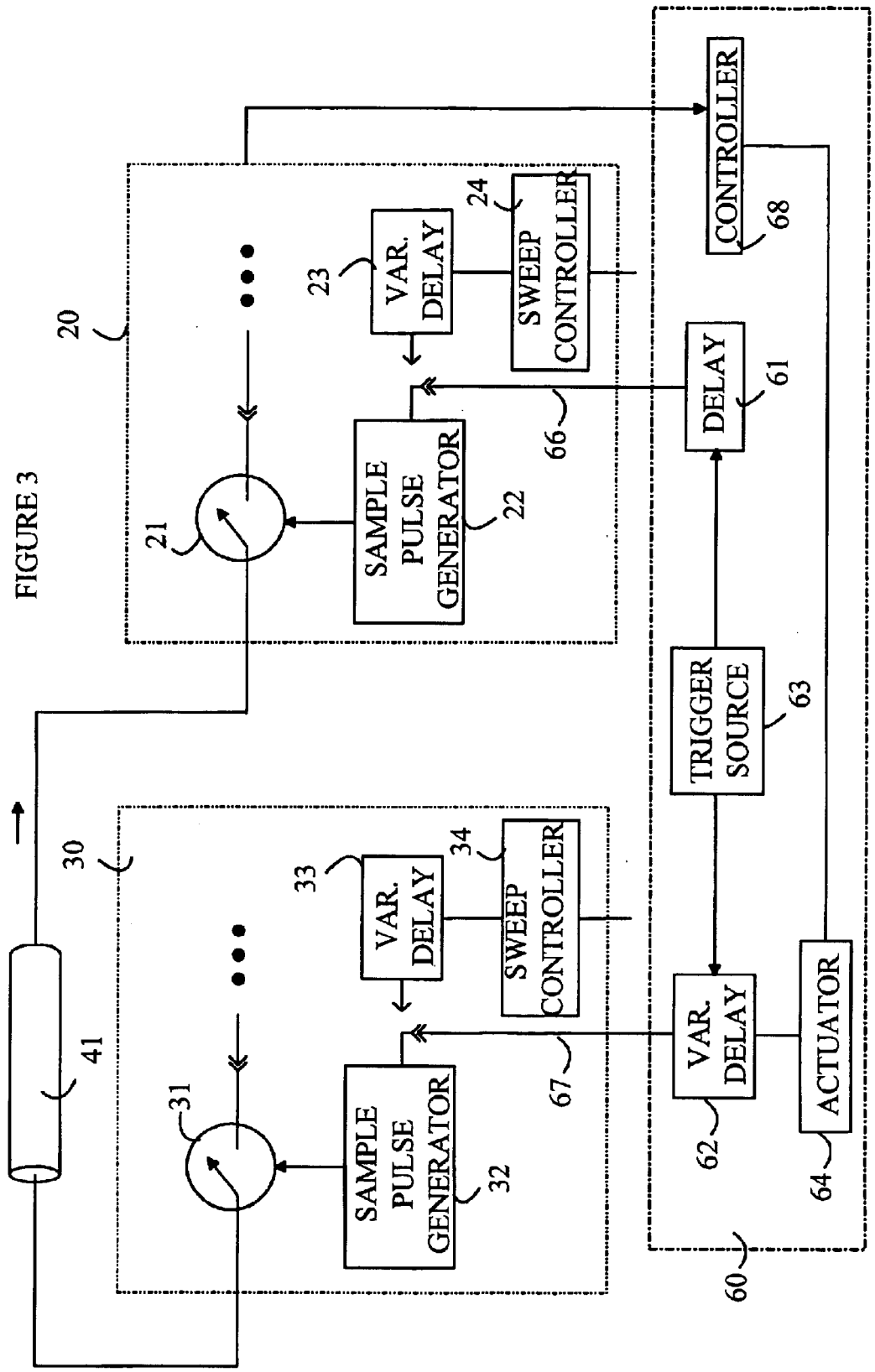
FIG. 3 is a schematic view of the two oscilloscopes shown in FIG. 2 connected to a test generator 60 according to the present invention.

By inserting a special "extension" board into the oscilloscope, the present invention gains access to the sample pulse generator and breaks the connection between the variable delay generator 23 and sample pulse generator 22. Refer now to FIG. 3, which is a schematic view of the two oscilloscopes shown in FIG. 2 connected to a test generator 60 according to one embodiment of the present invention. Test generator 60 connects to the two sampling pulse generators in the modules via two extension boards that provide traces 66 and 67 by which signals are transmitted to the sample pulse generators in the modules.

Test generator 60 directly drives the sample pulse generators and provides the variable delay function that is normally provided by variable delay circuit 23. As noted above, the variability and nonlinearity of the conventional delay circuits gives rise to the lengthy calibration procedure discussed above. In addition, since test generator 60 directly drives the sampling switch being measured, only one sampling pulse is generated for each delay setting.

The delay circuits utilized in test generator 60 are preferably delay lines. Delay circuit 61 is a manually adjustable mechanical delay line that is set once at the beginning of the test procedure. This delay circuit merely assures that the relative delays between the kick-out pulse and the sampling pulse in oscilloscope 20 are in the proper range. Delay line 62 is preferably a sliding delay line that is actuated by an actuator 64 such as a stepping motor. Such delay lines are very stable and provide a reproducible delay. Delay lines of this type are available commercially from Colby Instruments Inc, Santa Monica, Calif., for example model PDL10A.

Trigger pulse generator 63 and delay circuits 61 and 62 apply a sampling signal to oscilloscope 30 that generates a kick-out pulse that arrives at oscilloscope 20 after a delay determined by the delay circuits. The pulse applied via delay 61 directly operates sample generator 22. For each delay setting, the convolution of the kick-out pulse and sampling pulse is measured by oscilloscope 20. The measurements are repeated for each of a plurality of delay values.

Test generator 60 preferably includes a controller 68 that operates actuator 64 to set the relative delay between the kick-out pulse and the sampling pulse in oscilloscope 20. It is assumed that oscilloscope 20 includes a storage array and a mode in which oscilloscope 20 stores the successive measurement values of the signal captured by the sample and hold circuit in sampling switch 21. Controller 68 reads out these measurements prior to changing the delay setting to the next value in the sequence of measurements. In one embodiment of the present invention, the measurement is repeated a number of times and then averaged. Since the time to collect repeated measurements is much smaller than the time needed to change the delay setting, the number of measurements that are averaged to produce the final convolution value is typically determined by the storage capacity of the array in oscilloscope 20. In one embodiment of the present invention, controller 68 also performs the computations needed to convert the measured convolution values to the impulse response function.

While the embodiments discussed above utilize a controller in the test generator, embodiments in which this function is provided in the controller that performs the various internal control functions of oscilloscope 20 can also be practiced. Oscilloscope 20 typically has sufficient computing power to provide the required functions. If the impulse response function of a sampler is to be measured after the sampling module has been placed in the field, embodiments in which the test controller functionality is included in oscilloscope 20 are advantageous.

Since the variability of the internal delay circuit 23 has been eliminated, the various calibration procedures that limited the prior art systems are no longer needed. Hence, the time needed to measure the impulse response is mainly determined by the time needed to change the delay settings of delay line 62. Accordingly, a data collection process that would take in excess of 24 hours with the prior art methods can be performed in less than one hour. The measurement time obtained with the present invention is sufficiently short to allow the impulse response time of every sampling module to be measured during the manufacturing process.

The embodiments of the present invention discussed above utilize a variable delay line to provide the sweeping function. However, an electronic delay circuit could be utilized if a circuit having sufficient stability and linearity can be constructed. Such a circuit would further reduce the measurement time.

The above-described embodiments of the present invention utilize two sampling modules and assume that the sampling circuits are identical. However, the same procedure can be applied to three sampling modules having non-identical sampling circuits to arrive at the impulse response of the sampling circuit being calibrated. In this case, the method of the present invention is applied to the sampling modules in pairs. Since this methodology is described in the Jan Verspecht and Ken Rush article referenced above, it will not be discussed in detail here.

Various modifications to the present invention will become apparent to those skilled in the art from the foregoing description and accompanying drawings. Accordingly, the present invention is to be limited solely by the scope of the following claims.

What is claimed is:

1. An apparatus for calibrating a first sampling circuit with a second sampling circuit, each sampling circuit having a signal input for receiving a signal to be sampled and a trigger input for receiving a trigger pulse that opens a switching circuit in that sampling circuit, said second sampling circuit including a sample and hold circuit that provides an output indicative of the potential at said sampling circuit input of said second sampling circuit at a time determined by a signal at said trigger pulse input of said second sampling circuit, said signal inputs of said first and second sampling circuits being connected by a signal conductor, said first sampling circuit generating a pulse indicative of the impulse response of said first sampling circuit on said signal input of said first sampling circuit, said apparatus comprising:

a trigger pulse generating circuit that generates a sequence of trigger pulse pairs, each trigger pulse pair comprising a first pulse that is delayed relative to a second pulse;

a connecting circuit that applies said first pulse to said trigger input of said first sampling circuit and for applying said second pulse to said trigger input of said second sampling circuit; and a controller that sets said delay between said first and second pulses and for measuring said output of said sample and hold circuit in said second sampling circuit.

2. The apparatus of claim 1 wherein said trigger pulse generating circuit comprises a variable delay line.

3. The apparatus of claim 2 wherein said variable delay line comprises an actuator operable by said controller for setting said relative delay.

4. The apparatus of claim 2 wherein said trigger pulse generating circuit further comprises a fixed delay line.

5. The apparatus of claim 1 wherein said second sampling circuit is part of a module in an oscilloscope, said module being connected to said oscilloscope by an interface connector and wherein said connecting circuit comprises an extension device having a first connector that mates to said interface connector and a second connector that mates to said module.

6. A method for measuring the impulse response of a first sampling circuit with a second sampling circuit having an impulse response of approximately the same duration as said impulse response of said first sampling circuit, each sampling circuit having a signal input for receiving a signal to be sampled and a trigger input for receiving a trigger pulse that opens a switching circuit in that sampling circuit, said second sampling circuit comprising a sample and hold circuit that provides an output indicative of the potential at said sampling circuit input of said second sampling circuit at a time determined by a signal at said trigger pulse input of said second sampling circuit, said method comprising:

connecting said sample input of said first sampling circuit to said sample input of said second sampling circuit;

applying a first trigger pulse to said trigger pulse input of said first sampling circuit trigger input and applying a second trigger pulse to said sampling trigger input; and repeatedly measuring said output of said sample and hold circuit for different relative delays between said first and second trigger pulses.

7. The method of claim 6 wherein said relative delay is varied by altering the delay of a variable delay line.

8. The method of claim 6 wherein said second trigger pulse is applied to said second sampling circuit by connecting said second sampling circuit to an oscilloscope using an extension device that mates with a connector on a module containing said second sampling circuit and a connector in said oscilloscope configured to receive said module.

* * * * *